United States Patent
Hayashi et al.

(10) Patent No.: US 7,848,452 B2
(45) Date of Patent: Dec. 7, 2010

(54) DISTORTION COMPENSATING APPARATUS

(75) Inventors: Ryoji Hayashi, Tokyo (JP); Nobuhiko Ando, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 762 days.

(21) Appl. No.: 11/660,358

(22) PCT Filed: Sep. 13, 2004

(86) PCT No.: PCT/JP2004/013320

§ 371 (c)(1),
(2), (4) Date: Feb. 16, 2007

(87) PCT Pub. No.: WO2006/030481

PCT Pub. Date: Mar. 23, 2006

(65) Prior Publication Data

US 2007/0286307 A1    Dec. 13, 2007

(51) Int. Cl.
*H04L 27/36* (2006.01)
(52) U.S. Cl. ...................... 375/297; 375/298
(58) Field of Classification Search ......... 375/296–298, 375/302
See application file for complete search history.

(56) References Cited

U.S. PATENT DOCUMENTS 6,104,983 A * 8/2000 Nakada ................... 702/66
6,741,663 B1 * 5/2004 Tapio et al. .............. 375/297
6,771,708 B1   8/2004 Suga et al.
2002/0015450 A1 * 2/2002 Ratto ...................... 375/261
2006/0008030 A1 * 1/2006 Luke et al. ............... 375/298

FOREIGN PATENT DOCUMENTS

| JP | 06-268703 A | 9/1994 |
|---|---|---|
| JP | 2001-016283 A | 1/2001 |
| JP | 3144649 B2 | 1/2001 |
| JP | 2001-168774 A | 6/2001 |
| JP | 2002-077285 A | 3/2002 |
| WO | WO-03/081867 A1 | 10/2003 |

OTHER PUBLICATIONS

Koh Ri, Takeharu et al., "Automatic Self Correction Circuit using TDMA-TDD" STE Telecommunication Engineering Co., Ltd. and Casio Computer Co., Ltd., B-314 IEICE Spring Conference 1993. Publication Date: Mar. 15, 1993.
James K. Cavers, "The Effect of Quadrature Modulator and Demodulator Errors on Adaptive Digital Predistorters for Amplifier Linearization," IEEE Transactions on Vehicular Technology, vol. 46, No. 2, pp. 456-466, May 1997.

* cited by examiner

*Primary Examiner*—David B Lugo
(74) *Attorney, Agent, or Firm*—Birch, Stewart, Kolasch & Birch, LLP

(57) ABSTRACT

A distortion compensating apparatus has an IQ imbalance compensation coefficient arithmetic circuit 31 for calculating, from correlation values of a transmission signal and a feedback signal, IQ imbalance compensation coefficients for compensating for IQ imbalance in a quadrature modulator 23; and an IQ imbalance compensator 21 for compensating for the IQ imbalance with respect to a distortion compensated signal output from a distortion compensator 11 according to the IQ imbalance compensation coefficients, and for outputting to the quadrature demodulator 23.

11 Claims, 3 Drawing Sheets

DISTORTION COMPENSATING APPARATUS

TECHNICAL FIELD

The present invention relates to a distortion compensating apparatus for compensating for nonlinear distortion of a power amplifier for amplifying a transmission signal.

BACKGROUND ART

As shown in Patent Document 1, for example, a conventional distortion compensating apparatus has a problem in that its distortion compensation performance deteriorates because of the gain error and phase shift error of the π/2 phase shifter between the in-phase (I) channel component and quadrature (Q) channel component in a quadrature modulation circuit or quadrature demodulation circuit. Here, the gain error and the phase shift error are collectively called IQ imbalance.

In contrast with this, the Patent Document 1 circuit, in addition to the conventional distortion compensation circuit, compensates for the IQ imbalance by causing a waveform generating circuit to output a predetermined baseband signal, and by installing an error measuring circuit for measuring a demodulation error by extracting a demodulation signal corresponding to the baseband signal, and an error correcting circuit for eliminating the demodulation error from the demodulation signal.

In addition, although not describing the distortion compensating apparatus, Patent Document 2 and Non-Patent Document 1 each describes a technique for compensating for the IQ imbalance involved in the quadrature modulation.

The Patent Document 2 circuit compensates for the IQ imbalance by linearly converting the in-phase amplitude signal and quadrature amplitude signal with a linear converting means; by extracting a level signal by supplying a level signal generating means with a modulation wave output of the quadrature modulator to which the linearly converted signal is input; and by causing a parameter generating means to derive linear converting parameters for the level signal to be used for the linear conversion.

Although the first embodiment of the Patent Document 2 obtains the linear converting parameters from the level signal using a known test signal, the second embodiment obtains the linear converting parameters from the level signal in accordance with an in-phase and quadrature amplitude input. More specifically, instead of using the special test signal, the second embodiment calculates the linear converting parameters for the compensation by using particular values of a transmission signal such as values at the moment when the I component or Q component becomes zero, or when the I component becomes equal to the Q component.

Furthermore, the Non-Patent Document 1 describes an idea of adjusting the IQ imbalance of a quadrature modulation circuit and a quadrature demodulation circuit by using a loopback signal. However, it does not describe a concrete error detecting method or adjusting method.

Patent Document 1: Japanese patent application laid-open No. 6-268703/1994 (Paragraphs 0014 and 0019).

Patent Document 2: Japanese patent No. 3144649 (Paragraphs 0026-0028 and 0065-0068).

Non-Patent Document 1: Kohri, Yamamoto, Kawanaka, "Study of Automatic Adjusting Circuit Using TDMA-TDD" Proceedings of the 1993 IEICE Spring Conference, Mar. 15, 1993, No. 2, B-314.

It is necessary for the conventional distortion compensating apparatus using the technique of the Patent Document 1 or of the first embodiment of the Patent Document 2 to transmit the particular test signal to determine the IQ imbalance compensation coefficients (the linear converting parameters of the Patent Document 2) for compensating for the IQ imbalance. However, mobile communication or broadcasting base station equipment to which the distortion compensating apparatus is applied cannot transmit the particular test signal after their operation has been started because they operate continuously all day long. Thus, the IQ imbalance is compensated for by obtaining the IQ imbalance compensation coefficients only once by using the test signal before starting the operation after installing the base station. Accordingly, the distortion compensating apparatus has a problem of being unable to cope with temperature changes or aging phenomena after starting the operation, thereby deteriorating the distortion compensation performance.

In addition, it is necessary for the distortion compensating apparatus utilizing the technique of the second embodiment of the conventional Patent Document 2 to use the particular values of the transmission signal to determine the IQ imbalance compensation coefficient. However, there is no guarantee that the transmission signal with the specified particular values appear during the actual operation, and even if it appears it takes a long time before the appearance because the specified values are very rare and the probability of appearing is low. Thus, the distortion compensating apparatus has a problem of taking a long time before compensating for the IQ imbalance.

The present invention is implemented to solve the foregoing problems. Therefore it is an object of the present invention to provide a distortion compensating apparatus capable of obtaining the IQ imbalance compensation coefficients in real time using any given transmission signal, and capable of preventing the deterioration in the distortion compensation performance in spite of the temperature changes or aging after starting the operation.

DISCLOSURE OF THE INVENTION

A distortion compensating apparatus in accordance with the present invention includes a distortion compensator for compensating for distortion caused by a power amplifier mentioned below according to distortion compensation coefficients that are stored in a distortion compensation coefficient memory in connection with a transmission signal and that correspond to amplitude of the transmission signal; a quadrature modulator for carrying out quadrature modulation of a distortion compensated signal; a power amplifier for power amplifying a quadrature modulated signal; a quadrature demodulator for carrying out quadrature demodulation of a power amplified signal and for outputting a feedback signal; a distortion compensation coefficient arithmetic circuit for calculating, from the transmission signal and the feedback signal, distortion compensation coefficients corresponding to the amplitude of the transmission signal, and for updating distortion compensation coefficients stored in the distortion compensation coefficient memory; an IQ imbalance compensation coefficient arithmetic circuit for calculating, from correlation values of the transmission signal and the feedback signal, IQ imbalance compensation coefficients for compensating for IQ imbalance in the quadrature modulator; and an IQ imbalance compensator for compensating for the IQ imbalance with respect to the distortion compensated signal output from the distortion compensator according to the IQ imbalance compensation coefficients, and for outputting to the quadrature demodulator.

The present invention can obtain the IQ imbalance compensation coefficients in real time using any given transmission signal. Consequently the present invention offers an advantage of being able to compensate for the IQ imbalance using the transmission signal in operation in spite of the temperature changes or aging after starting the operation, and to prevent the deterioration in the distortion compensation performance.

BEST MODE FOR CARRYING OUT THE INVENTION

The best mode for carrying out the invention will now be described with reference to the accompanying drawings to explain the present invention in more detail.

Embodiment 1

Figure 1:
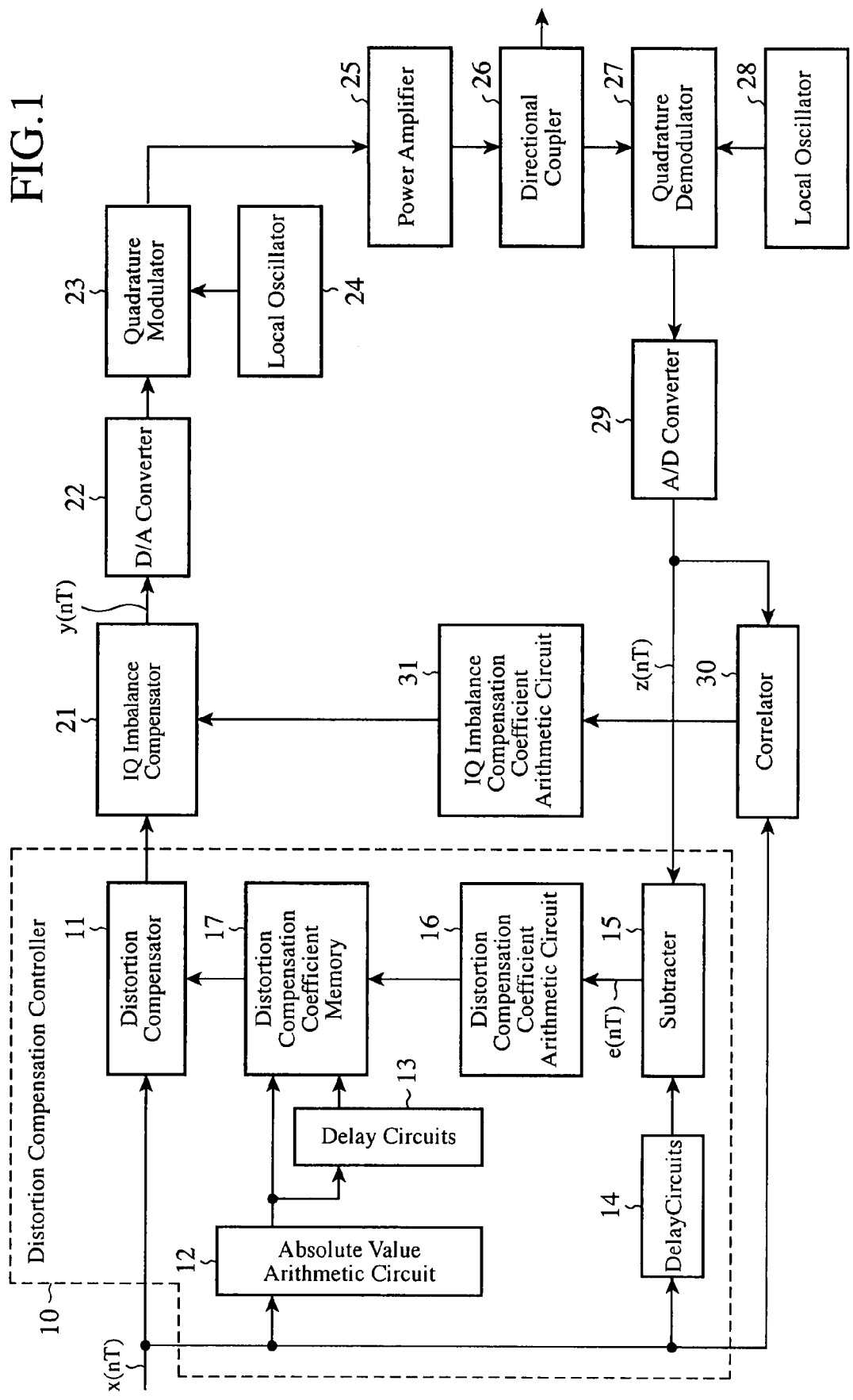
FIG. 1 is a block diagram showing a configuration of the distortion compensating apparatus of an embodiment 1 in accordance with the present invention.

FIG. 1 is a block diagram showing a configuration of the distortion compensating apparatus of an embodiment 1 in accordance with the present invention. The distortion compensating apparatus has a distortion compensation controller 10, an IQ imbalance compensator 21, a D/A (digital/analog) converter 22, a quadrature modulator 23, a local oscillator 24, a power amplifier 25, a directional coupler 26, a quadrature demodulator 27, a local oscillator 28, an A/D (analog/digital) converter 29, a correlator 30 and an IQ imbalance compensation coefficient arithmetic circuit 31.

The distortion compensation controller 10 has a distortion compensator 11, an absolute value arithmetic circuit 12, delay circuits 13 and 14, a subtracter 15, a distortion compensation coefficient arithmetic circuit 16, and a distortion compensation coefficient memory 17.

Next, the operation will be described.

The distortion compensator 11 of the distortion compensation controller 10 compensates for the distortion generated by the power amplifier 25 by performing the complex multiplication of the transmission signal $x(nT)$ (n is a sampling number and T is a sampling period) and distortion compensation coefficients corresponding to the amplitude $|x(nT)|$ of the transmission signal $x(nT)$, which are stored in the distortion compensation coefficient memory 17, thereby outputting a distortion compensated signal. The IQ imbalance compensator 21 compensates for the IQ imbalance by performing the complex multiplication of the distortion compensated signal from the distortion compensator 11 and the IQ imbalance compensation coefficients for compensating for the IQ imbalance computed by the IQ imbalance compensation coefficient arithmetic circuit 31. Thus, the IQ imbalance compensator 21 compensates for the gain error and the phase shift error of the π/2 phase shifter between the in-phase (I) channel component and quadrature (Q) channel component in the quadrature modulator 23, and outputs an IQ imbalance compensated signal $y(nT)$. The D/A converter 22 carries out the D/A conversion of the IQ imbalance compensated signal $y(nT)$ output from the IQ imbalance compensator 21, thereby outputting a complex baseband signal.

The quadrature modulator 23 carries out the quadrature modulation of the complex baseband signal output from the D/A converter 22 with the oscillation signal from the local oscillator 24. The power amplifier 25 performs the power amplification of the quadrature modulated signal fed from the quadrature modulator 23. During the power amplification, nonlinear distortion occurs. The directional coupler 26 supplies the signal amplified by the power amplifier 25 to an antenna not shown, extracts part of the signal and supplies it to the quadrature demodulator 27. The quadrature demodulator 27 carries out the quadrature demodulation of the signal fed from the directional coupler 26 with the oscillation signal from the local oscillator 28. The A/D converter 29 performs the A/D conversion of the quadrature demodulated signal output from the quadrature demodulator 27 and outputs a feedback signal $z(nT)$.

The absolute value arithmetic circuit 12 of the distortion compensation controller 10 calculates the amplitude $|x(nT)|$ of the transmission signal $x(nT)$. When calculating, by using the error signal $e(nT)$, the distortion compensation coefficients corresponding to the amplitude $|x(nT)|$ of the transmission signal $x(nT)$ calculated by the absolute value arithmetic circuit 12, the delay circuit 13 sets the timing in such a manner as to write them to the address of the distortion compensation coefficient memory 17 corresponding to the amplitude $|x(nT)|$ of the transmission signal $x(nT)$. The delay circuit 14 provides the transmission signal $x(nT)$ with the delay corresponding to the duration during which the transmission signal $x(nT)$ becomes the feedback signal $z(nT)$ through the distortion compensator 11, IQ imbalance compensator 21, D/A converter 22, quadrature modulator 23, power amplifier 25, directional coupler 26, quadrature demodulator 27, and A/D converter 29, thereby adjusting the timing between the feedback signal $z(nT)$ and the transmission signal $x(nT)$.

The subtracter 15 of the distortion compensation controller 10 subtracts the transmission signal $x(nT)$ whose timing is adjusted by the delay circuit 14 from the feedback signal $z(nT)$ output from the A/D converter 29, and outputs the error signal $e(nT)$. Using the error signal $e(nT)$ output from the subtracter 15, the distortion compensation coefficient arithmetic circuit 16 calculates the distortion compensation coefficients, and updates the distortion compensation coefficients stored in the distortion compensation coefficient memory 17. The distortion compensation coefficient memory 17 writes the distortion compensation coefficients that are calculated and updated by the distortion compensation coefficient arithmetic circuit 16 into the address corresponding to the amplitude $|x(nT)|$ of the transmission signal $x(nT)$, and reads the distortion compensation coefficients corresponding to the amplitude $|x(nT)|$ of the transmission signal $x(nT)$. The distortion compensator 11 compensates for the distortion caused by the power amplifier 25 by performing complex multiplication of the transmission signal $x(nT)$ and the distortion compensation coefficients corresponding to the amplitude $|x(nT)|$ of the transmission signal $x(nT)$ read from the distortion compensation coefficient memory 17, and outputs the distortion compensated signal.

The correlator 30 calculates correlation values of the real part $x_I(nT)$ and imaginary part $x_Q(nT)$ of the transmission signal $x(nT)$ and the real part $z_I(nT)$ and imaginary part $z_Q(nT)$ of the feedback signal $z(nT)$. The IQ imbalance compensation coefficient arithmetic circuit 31 calculates the IQ imbalance compensation coefficients for compensating for the IQ imbalance from the correlation values calculated by the correlator 30, that is, the IQ imbalance compensation coefficients for compensating for the gain error and the phase shift error of the π/2 phase shifter between the in-phase (I) channel component and quadrature (Q) channel component in the quadrature modulator 23.

Next, the compensation processing of the IQ imbalance will be described in more detail.

Let us assume here that the distortion caused by the power amplifier 25 is negligibly small. Then the initial value of the distortion compensation coefficients stored in the distortion compensation coefficient memory 17 is one. In addition, when the IQ imbalance is not compensated, the initial value of the IQ imbalance compensation coefficients calculated by the IQ imbalance compensation coefficient arithmetic circuit 31 is also one. In this case, the output signal y(nT) of the IQ imbalance compensator 21 is equal to the transmission signal x(nT) as shown by the following expressions (1) and (2).

$$y_I(nT) = x_I(nT) \tag{1}$$

$$y_Q(nT) = x_Q(nT) \tag{2}$$

Assume in the quadrature modulator 23 that the gain error, which is given by the ratio between the voltage gain of the in-phase (I) channel component and that of the quadrature (Q) channel component, is α; and that the phase shift error of the π/2 phase shifter is ε. Then the output of the quadrature modulator 23 is given by the following expression (3).

$$y_I(nT) \cos n\omega T - \alpha y_Q(nT) \sin (n\omega T + \epsilon) \tag{3}$$

where ω is the angular frequency of the oscillation signal of the local oscillator 24. As for the output of the quadrature modulator 23 given by the foregoing expression (3), after being amplified by the power amplifier 25, its part is extracted by the directional coupler 26.

Assume that the directional coupler 26 gives a phase rotation δ. Then the signal input to the quadrature demodulator 27 is given by the following expression (4), where a is the voltage gain of the power amplifier 25 and directional coupler 26 in combination.

$$a y_I(nT) \cos (n\omega T + \delta) - a\alpha y_Q(nT) \sin (n\omega T + \epsilon + \delta) \tag{4}$$

The quadrature demodulator 27 multiplies the signal given by the foregoing expression (4) by the local oscillation signal fed from the local oscillator 28 and the local oscillation signal passing through the π/2 phase shifter, and the low-pass filter removes the second harmonic of the local oscillation signal. Assume that the quadrature demodulator 27 has no IQ imbalance, then its output converted by the A/D converter 29, that is, the feedback signal z(nT) is given by the following expressions (5) and (6).

$$z_I(nT) = a y_I(nT) \cos \delta - a\alpha y_Q(nT) \sin (\epsilon + \delta) \tag{5}$$

$$z_Q(nT) = a y_I(nT) \sin \delta + a\alpha y_Q(nT) \sin (\epsilon + \delta) \tag{6}$$

Thus, the following expressions (7) and (8) are obtained from the foregoing expressions (1) and (2).

$$z_I(nT) = a x_I(nT) \cos \delta - a\alpha x_Q(nT) \sin (\epsilon + \delta) \tag{7}$$

$$z_Q(nT) = a x_I(nT) \sin \delta + a\alpha x_Q(nT) \cos (\epsilon + \delta) \tag{8}$$

The correlator 30 calculates autocorrelations A, B and C of $x_I(nT)$ and $x_Q(nT)$ by the following expressions (9)-(11), and cross-correlations D, E, F and G of $x_I(nT)$, $x_Q(nT)$, $z_I(nT)$ and $z_Q(nT)$ by the following expressions (12)-(15).

$$A = \sum_{n=0}^{N-1} x_I^2(nT) \tag{9}$$

$$B = \sum_{n=0}^{N-1} x_I(nT) x_Q(nT) \tag{10}$$

$$C = \sum_{n=0}^{N-1} x_Q^2(nT) \tag{11}$$

$$D = \sum_{n=0}^{N-1} x_I(nT) z_I(nT) \tag{12}$$

$$E = \sum_{n=0}^{N-1} x_I(nT) z_Q(nT) \tag{13}$$

$$F = \sum_{n=0}^{N-1} x_Q(nT) z_I(nT) \tag{14}$$

$$G = \sum_{n=0}^{N-1} x_Q(nT) z_Q(nT) \tag{15}$$

The IQ imbalance compensation coefficient arithmetic circuit 31 calculates the IQ imbalance compensation coefficients α, sin ε, a and sin δ by the following expressions (20)-(23) by calculating the following expressions (16)-(19) from the foregoing expressions (9)-(15), and by solving the expressions (16)-(19).

$$D = aA \cos \delta - a\alpha B \sin (\epsilon + \delta) \tag{16}$$

$$E = aA \sin \delta + a\alpha B \cos (\epsilon + \delta) \tag{17}$$

$$F = aB \cos \delta - a\alpha C \sin (\epsilon + \delta) \tag{18}$$

$$G = aB \sin \delta + a\alpha C \cos (\epsilon + \delta) \tag{19}$$

$$\alpha = \sqrt{\frac{(AF - BD)^2 + (AG - BE)^2}{(CD - BF)^2 + (CE - BG)^2}} \tag{20}$$

$$\sin \epsilon = -\frac{(AF - BD)(CD - BF) + (AG - BE)(CE - BG)}{\sqrt{(AF - BD)^2 + (AG - BE)^2} \sqrt{(CD - BF)^2 + (CE - BG)^2}} \tag{21}$$

$$a = \frac{\sqrt{(CD - BF)^2 + (CE - BG)^2}}{AC - B^2} \tag{22}$$

$$\sin \delta = \frac{CE - BG}{\sqrt{(CD - BF)^2 + (CE - BG)^2}} \tag{23}$$

In particular, when transmitting a multiplex signal of OFDM or CDMA as the transmission signal x(nT), the real part $x_I(nT)$ and imaginary part $x_Q(nT)$ of the transmission signal x(nT) are considered to have no correlation. Thus, it is possible to place as follows.

$$B = 0 \tag{24}$$

In this case, the foregoing expressions (20)-(23) become the following expressions (25)-(28).

$$\alpha = \frac{A}{C}\sqrt{\frac{F^2 + G^2}{D^2 + E^2}} \quad (25)$$

$$\sin\varepsilon = -\frac{DF + EG}{\sqrt{D^2 + E^2}\sqrt{F^2 + G^2}} \quad (26)$$

$$a = \frac{\sqrt{D^2 + E^2}}{A} \quad (27)$$

$$\sin\delta = \frac{E}{\sqrt{D^2 + E^2}} \quad (28)$$

The IQ imbalance compensator 21 solves the foregoing expressions (7) and (8) in terms of $x_I(nT)$ and $x_Q(nT)$, and gives the following expressions (29) and (30).

$$x_I(nT) = \frac{z_I(nT)\cos(\varepsilon + \delta) + z_Q(nT)\sin(\varepsilon + \delta)}{a\cos\varepsilon} \quad (29)$$

$$x_Q(nT) = \frac{-z_I(nT)\sin\delta + z_Q(nT)\cos\delta}{a\alpha\cos\varepsilon} \quad (30)$$

The foregoing expressions (29) and (30) give the inverse function which indicates the values of the transmission signal $x(nT)$ when the feedback signal $z(nT)$ is given.

Then, the IQ imbalance compensator 21 carries out the complex multiplication of the transmission signal given by the foregoing expressions (29) and (30) and the IQ imbalance compensation coefficients calculated by the IQ imbalance compensation coefficient arithmetic circuit 31 using expressions (20)-(23) or expressions (25)-(28), converts the transmission signals $x_I(nT)$ and $x_Q(nT)$ to $y_I(nT)$ and $y_Q(nT)$ as shown by the following expressions (31) and (32), and outputs them.

$$y_I(nT) = \frac{x_I(nT)\cos(\varepsilon + \delta) - x_Q(nT)\sin(\varepsilon + \delta)}{\alpha\cos\varepsilon} \quad (31)$$

$$= \frac{AC - B^2}{(AG - BE)(CD - BF) - (AF - BD)(CE - BG)} \times$$

$$\{(AG - BE)x_I(nT) - (AF - BD)x_Q(nT)\}$$

$$y_Q(nT) = \frac{-x_I(nT)\sin\delta + x_Q(nT)\cos\delta}{a\alpha\cos\varepsilon} \quad (32)$$

$$= \frac{AC - B^2}{(AG - BE)(CD - BF) - (AF - BD)(CE - BG)} \times$$

$$\{-(CE - BG)x_I(nT) + (CD - BF)x_Q(nT)\}$$

In particular, when there is no correlation between the real part $x_I(nT)$ and imaginary part $x_Q(nT)$ of the transmission signal $x(nT)$, the following expressions hold.

$$y_I(nT) = \frac{AGx_I(nT) - AFx_Q(nT)}{DG - EF}$$

$$y_Q(nT) = \frac{-CEx_I(nT) + CDx_Q(nT)}{DG - EF}$$

When the IQ imbalance compensator 21 outputs $y_I(nT)$ and $y_Q(nT)$ given by the foregoing expressions (31) and (32), the A/D converter 29 outputs the feedback signals $z_I(nT)$ and $z_Q(nT)$ given by the following expressions (33) and (34), which are obtained by substituting the foregoing expressions (31) and (32) into the foregoing expressions (5) and (6).

$$z_I(nT) = x_I(nT) \quad (33)$$

$$z_Q(nT) = x_Q(nT) \quad (34)$$

The foregoing expressions (33) and (34) mean that the IQ imbalance compensator 21, outputting $y_I(nT)$ and $y_Q(nT)$ given by the foregoing expressions (31) and (32), compensates for the IQ imbalance in the quadrature modulator 23. In this way, it can prevent the deterioration in the distortion compensation performance due to the IQ imbalance.

As described above, the present embodiment 1 can obtain the IQ imbalance compensation coefficients in real time using any given transmission signal $x(nT)$ by obtaining the correlation between the any given transmission signal $x(nT)$ and its feedback signal $z(nT)$. Accordingly, the present embodiment 1 offers an advantage of being able to compensate for the IQ imbalance using the current transmission signal $x(nT)$ in spite of the temperature changes or aging after starting the operation, and to prevent the deterioration in the distortion compensation performance.

Embodiment 2

The foregoing embodiment 1 assumes that the timings between the feedback signal $z(nT)$ and transmission signal $x(nT)$ are adjusted by the delay circuits 13 and 14. Even in the case where the timings between the feedback signal $z(nT)$ and transmission signal $x(nT)$ are off, and in addition, the IQ imbalance occurs, the present embodiment 2 carries out the IQ imbalance compensation after making timing adjustment.

Figure 2:
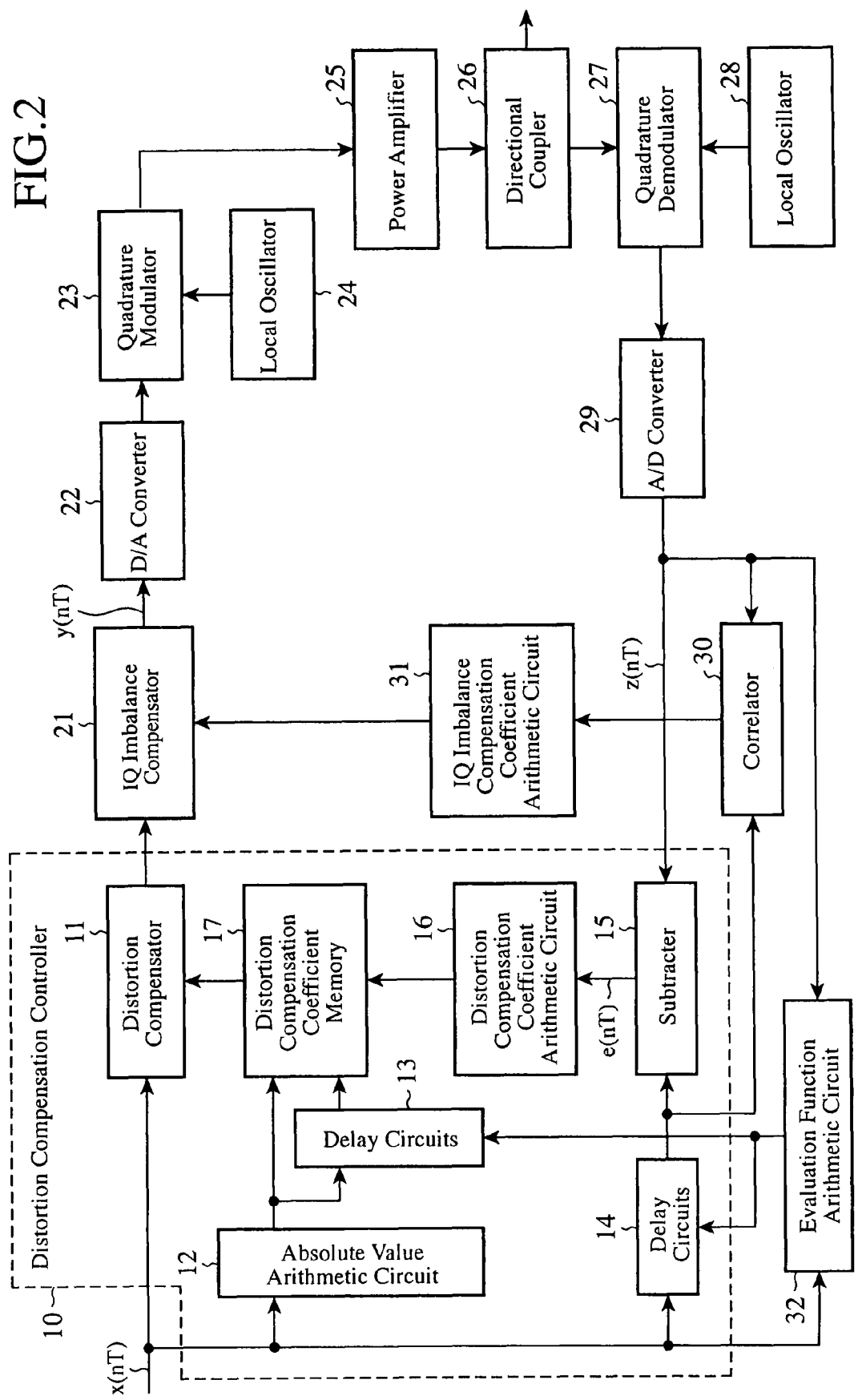
FIG. 2 is a block diagram showing a configuration of the distortion compensating apparatus of an embodiment 2 in accordance with the present invention.

FIG. 2 is a block diagram showing a configuration of the distortion compensating apparatus of an embodiment 2 in accordance with the present invention, which includes an evaluation function arithmetic circuit 32 in addition to the foregoing embodiment 1 shown in FIG. 1. In FIG. 2, since the remaining components are the same as those of FIG. 1, they are designated by the same reference numerals and their description will be omitted here.

Next the operation will be described.

The evaluation function arithmetic circuit 32, varying the delay τ of the transmission signal $x(nT)$, calculates the evaluation function $S(\tau)$ of the transmission signal $x(nT)$ and feedback signal $z(nT)$ output from the A/D converter 29, and sets the delay τ at which the evaluation function $S(\tau)$ becomes maximum or minimum to the delay circuits 13 and 14.

Here, the evaluation function arithmetic circuit 32 uses as the evaluation function $S(\tau)$ the cross-correlation or error sum of squares of the amplitude $|x(nT)|$ of the transmission signal $x(nT)$ and the amplitude $|z(nT)|$ of the feedback signal $z(nT)$ given by the following expressions (35) and (36), for example.

$$S(\tau) = \sum_{n=0}^{N-1} |x(nT)z(nT + \tau)| \quad (35)$$

$$S(\tau) = \sum_{n=0}^{N-1} (|x(nT)| - |z(nT + \tau)|)^2 \quad (36)$$

Assume that the distortion of the power amplifier 25 is small enough and the quadrature modulator 23 and quadrature demodulator 27 have no IQ imbalance. In this case, at the delay τ at which the timing of feedback signal z(nT) matches the timing of the transmission signal x(nT), the evaluation function S(τ) becomes maximum when it is the cross-correlation, and the evaluation function S(τ) becomes minimum when it is the error sum of squares. The evaluation function arithmetic circuit 32 sets the delay corresponding to the delay τ thus obtained to the delay circuits 13 and 14, thereby enabling the timing adjustment.

When the IQ imbalance is negligible, the timing adjustment is completed. However, when the IQ imbalance is not negligible, the delay obtained deviates from the correct delay because of the effect of the IQ imbalance.

Figure 3:
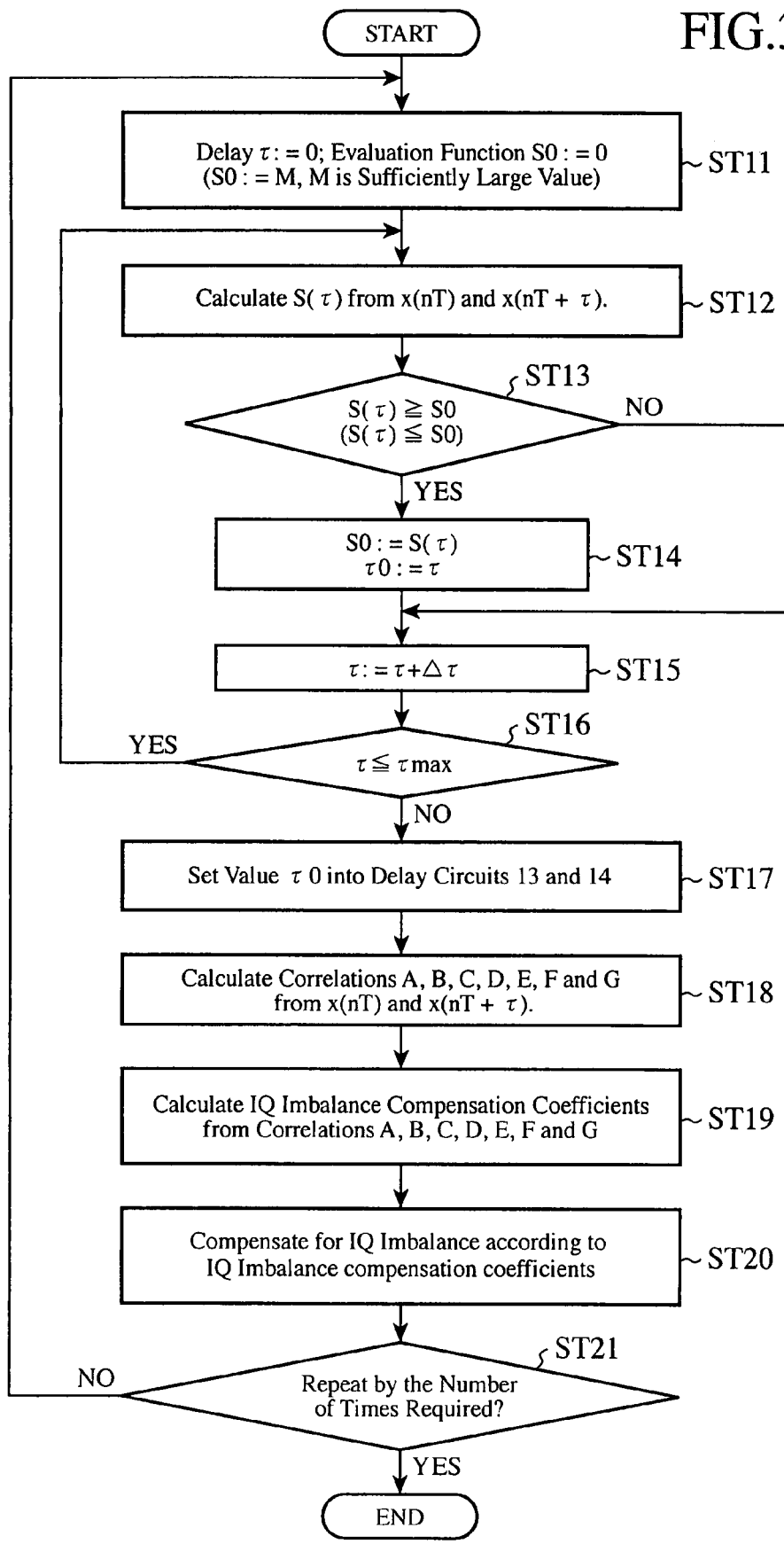
FIG. 3 is a flowchart illustrating a flow of the timing adjusting processing between the transmission signal and feedback signal and the IQ imbalance compensation processing in the distortion compensating apparatus of the embodiment 2 in accordance with the present invention.

FIG. 3 is a flowchart illustrating a flow of the timing adjusting processing between the transmission signal and feedback signal and the IQ imbalance compensation processing in the distortion compensating apparatus of the embodiment 2 in accordance with the present invention. In FIG. 3, steps ST11-ST17 show the calculation of the evaluation function S(τ) and the timing adjusting processing by the evaluation function arithmetic circuit 32, and step ST18-ST20 show compensation processing of the IQ imbalance, which is the same as that of the embodiment 1.

At step ST11, the evaluation function arithmetic circuit 32 sets the delay τ of the transmission signal x(nT) at zero; and sets the register of the evaluation function S0 at zero when using the cross-correlation as the evaluation function, and at M (M is a sufficiently large value) when using the error sum of squares as the evaluation function. At step ST12, the evaluation function arithmetic circuit 32 calculates the evaluation function S(τ) from the transmission signal x(nT) and the feedback signal z(nT+τ) fed from the A/D converter 29.

At step ST13, the evaluation function arithmetic circuit 32 makes a decision as to whether S(τ) calculated at step ST12 is greater than S0 (=0) set at step ST11 when using the cross-correlation as the evaluation function, and as to whether S(τ) calculated at step ST12 is smaller than S0 (=M) set at step ST11 when using the error sum of squares as the evaluation function.

When the decision result at step ST13 is YES, the evaluation function arithmetic circuit 32 sets S(τ) calculated at step ST12 into the register of the evaluation function S0 at step ST14, and sets the delay τ at that time into the register of delay τ0. On the other hand, when the decision result at step ST13 is NO, the evaluation function arithmetic circuit 32 skips the processing of step ST14, and proceeds to the processing of step ST15.

At step ST15, the evaluation function arithmetic circuit 32 increments the delay τ of the transmission signal x(nT) by Δτ. At step ST16, the evaluation function arithmetic circuit 32 makes a decision as to whether the delay τ is less than a predetermined maximum delay τmax, and when τ is less than τmax, it repeats the processing from step ST12 to step ST15. When τ exceeds τmax at step ST16, the evaluation function arithmetic circuit 32 sets the value of delay τ, which is set in the register of delay τ0 at step ST14, into the delay circuits 13 and 14 at step ST17.

At step ST18, the correlator 30 calculates the correlations A, B, C, D, E, F and G from the transmission signal x(nT) and feedback signal z(nT+τ) according to the foregoing expressions (9)-(15). At step ST19, the IQ imbalance compensation coefficient arithmetic circuit 31 calculates the IQ imbalance compensation coefficients α, sin ϵ, a and sin δ from the correlations A, B, C, D, E, F and G obtained at step ST18 using the foregoing expressions (20)-(23) or the foregoing expressions (25)-(28). At step ST20, the IQ imbalance compensator 21 compensates for the IQ imbalance by carrying out the complex multiplication of the transmission signal fed from the distortion compensator 11 and the IQ imbalance compensation coefficients α, sin ϵ, a and sin δ calculated at step ST19.

If the foregoing processing cannot complete the compensation for the IQ imbalance, the processing from step ST11 to step ST20 is repeated at step ST21 by a predetermined number of times as needed.

As described above, even if there is a deviation between the timing of transmission signal x(nT) and that of the feedback signal z(nT) and there is the IQ imbalance, the present embodiment 2 can obtain the IQ imbalance compensation coefficients in real time using any given transmission signal x(nT) by obtaining the correlation between the any given transmission signal x(nT) and its feedback signal z(nT) after adjusting the timing of the transmission signal x(nT) and feedback signal z(nT) by obtaining the delay that will maximize or minimize the evaluation function such as the cross-correlation or error sum of squares of the any given transmission signal x(nT) and feedback signal z(nT). Accordingly, the present embodiment 2 offers an advantage of being able to carry out the timing adjustment and compensate for the IQ imbalance using the current transmission signal x(nT) in spite of the temperature changes or aging after starting the operation, and to prevent the deterioration in the distortion compensation performance.

Although the foregoing embodiments 1 and 2 have the IQ imbalance compensator 21 between the distortion compensator 11 and the D/A converter 22 so that the IQ imbalance compensator 21 carries out the IQ imbalance compensation processing in digital processing, this is not essential. For example, the IQ imbalance compensator 21 can be interposed between the D/A converter 22 and the quadrature modulator 23 in order to carry out the IQ imbalance compensation processing in an analog mode after the output of the IQ imbalance compensation coefficient arithmetic circuit 31 undergoes the D/A conversion.

INDUSTRIAL APPLICABILITY

As described above, the distortion compensating apparatus in accordance with the present invention can obtain the IQ imbalance compensation coefficients in real time, and can compensate for the IQ imbalance using the current transmission signal x(nT) in spite of the temperature changes or aging after starting the operation. Thus, it is suitable for equipment that needs preventing the deterioration in the distortion compensation performance.

What is claimed is:

1. A distortion compensating apparatus comprising:
  a distortion compensator for compensating for distortion caused by a power amplifier according to distortion compensation coefficients that are stored in a distortion compensation coefficient memory in connection with a transmission signal and that correspond to amplitude of the transmission signal;
  a quadrature modulator for carrying out quadrature modulation of a distortion compensated signal;
  a power amplifier for power amplifying a quadrature modulated signal;
  a quadrature demodulator for carrying out quadrature demodulation of a power amplified signal and for outputting a feedback signal;
  a distortion compensation coefficient arithmetic circuit for calculating, from the transmission signal and the feedback signal, distortion compensation coefficients corresponding to the amplitude of the transmission signal, and for updating distortion compensation coefficients stored in the distortion compensation coefficient memory;

an IQ imbalance compensation coefficient arithmetic circuit for calculating, from correlation values of the transmission signal and the feedback signal, IQ imbalance compensation coefficients in real time for compensating for IQ imbalance in said quadrature modulator; and an IQ imbalance compensator for compensating for the IQ imbalance with respect to the distortion compensated signal output from said distortion compensator according to the IQ imbalance compensation coefficients obtained in real time, and for outputting an IQ imbalance compensated signal to said quadrature modulator.

2. The distortion compensating apparatus according to claim 1, further comprising:

a delay circuit for adjusting timing of the transmission signal and the feedback signal; and an evaluation function arithmetic circuit for obtaining a delay of said delay circuit from the transmission signal and the feedback signal, and sets the delay into said delay circuit, wherein processing by said evaluation function arithmetic circuit is followed by processing by said IQ imbalance compensation coefficient arithmetic circuit and processing by said IQ imbalance compensator.

3. The distortion compensating apparatus according to claim 2, which repeatedly carries out the processing by said evaluation function arithmetic circuit, the processing by said IQ imbalance compensation coefficient arithmetic circuit and the processing by said IQ imbalance compensator.

4. The distortion compensating apparatus according to claim 2, wherein said evaluation function arithmetic circuit obtains the delay of said delay circuit using, as evaluation function, cross-correlation or error sum of squares between the transmission signal and the feedback signal.

5. The distortion compensating apparatus according to claim 4, wherein at a delay at which the timing of transmission signal and the timing of the feedback signal matches, said evaluation function becomes maximum when said evaluation function arithmetic circuit uses cross-correlation between the transmission signal and the feedback signal as the evaluation function.

6. The distortion compensating apparatus according to claim 4, wherein at a delay at which the timing of transmission signal and the timing of the feedback signal matches, said evaluation function becomes minimum when said evaluation function arithmetic circuit uses error sum of squares between the transmission signal and the feedback signal as the evaluation function.

7. A distortion compensating method comprising:

compensating for distortion caused by a power amplifier according to distortion compensation coefficients that are stored in a distortion compensation coefficient memory in connection with a transmission signal and that correspond to amplitude of the transmission signal;

outputting a distortion compensated signal;

carrying out, by utilizing a quadrature modulator, quadrature modulation of said distortion compensated signal and for outputting a quadrature modulated signal;

power amplifying said quadrature modulated signal;

carrying out, by utilizing a quadrature demodulator, quadrature demodulation of a power amplified signal and for outputting a feedback signal;

calculating, from the transmission signal and the feedback signal, distortion compensation coefficients corresponding to the amplitude of the transmission signal, and for updating distortion compensation coefficients stored in the distortion compensation coefficient memory;

calculating, from correlation values of the transmission signal and the feedback signal, IQ imbalance compensation coefficients in real time for compensating for IQ imbalance in said quadrature modulator;

compensating for the IQ imbalance with respect to the outputted distortion compensated signal according to the IQ imbalance compensation coefficients obtained in real time; and outputting an IQ imbalance compensated signal to said quadrature modulator.

8. The distortion compensating method according to claim 7, further comprising:

adjusting, by utilizing a delay circuit, timing of the transmission signal and the feedback signal; and obtaining a delay of said delay circuit from the transmission signal and the feedback signal; and setting the delay into said delay circuit.

9. The distortion compensating method according to claim 8, wherein obtaining the delay of said delay circuit using, as evaluation function, cross-correlation or error sum of squares between the transmission signal and the feedback signal.

10. The distortion compensating method according to claim 9, wherein at a delay at which the timing of transmission signal and the timing of the feedback signal matches, said evaluation function becomes maximum when cross-correlation between the transmission signal and the feedback signal is used as the evaluation function.

11. The distortion compensating method according to claim 9, wherein at a delay at which the timing of transmission signal and the timing of the feedback signal matches, said evaluation function becomes minimum when error sum of squares between the transmission signal and the feedback signal is used as the evaluation function.

* * * * *